(12) United States Patent
Ram et al.

(10) Patent No.: US 11,182,288 B2
(45) Date of Patent: Nov. 23, 2021

(54) DECODING OF HIGH-DENSITY MEMORY CELLS IN A SOLID-STATE DRIVE

(71) Applicant: Marvell Asia Pte Ltd., Singapore (SG)

(72) Inventors: B Hari Ram, Chennai (IN); Vijay Ahirwar, Pune (IN); Sri Varsha Rottela, Visakhapatnam (IN); Nilesh N. Khude, Pune (IN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/796,378

(22) Filed: Feb. 20, 2020

(65) Prior Publication Data

US 2020/0264974 A1 Aug. 20, 2020

Related U.S. Application Data

(60) Provisional application No. 62/808,072, filed on Feb. 20, 2019.

(51) Int. Cl.
| | |
|---|---|
| *G11C 11/56* | (2006.01) |
| *G06F 12/02* | (2006.01) |
| *G06N 20/00* | (2019.01) |
| *G11C 16/04* | (2006.01) |
| *G11C 16/10* | (2006.01) |
| *G11C 16/26* | (2006.01) |

(52) U.S. Cl.
CPC ......... *G06F 12/0246* (2013.01); *G06N 20/00* (2019.01); *G11C 16/0483* (2013.01); *G11C 16/10* (2013.01); *G11C 16/26* (2013.01); *G06F 2212/1008* (2013.01); *G06F 2212/2022* (2013.01)

(58) Field of Classification Search
CPC .................................................. G11C 11/5628

USPC .................................................... 365/185.18
See application file for complete search history.

(56) References Cited

U.S. PATENT DOCUMENTS

| | | |
|---|---|---|
| 8,189,410 B1 | 5/2012 | Morton |
| 2009/0080259 A1 | 3/2009 | Alrod et al. |
| | (Continued) | |

FOREIGN PATENT DOCUMENTS

CN 105159840 B 11/2018

OTHER PUBLICATIONS

Buzaglo, et al., "Row-by-Row Coding Schemes for Inter-Cell Interference in Flash Memory", 2015 IEEE Internationa Symposium on Information Theory (ISIT) (2015): 1736-1740.

(Continued)

*Primary Examiner* — Jason Lappas

(57) ABSTRACT

A method of decoding data from high density memory includes reading voltage levels from a first memory cell and a set of one or more neighboring memory cells of flash memory in response to a read command with an address corresponding to the first memory cell, inputting the voltage levels into a trained model that has been trained on the flash memory to estimate bit values written to a memory cell based on respective voltage values read from the first memory cell and from the neighboring memory cells according to a layout of memory cells of the flash memory, obtaining from the trained model an estimated bit value written to the first memory cell based on the respective voltage levels of the first memory cell and the neighboring memory cells having been input into the trained model, and outputting the estimated hit value in response to the read command.

20 Claims, 4 Drawing Sheets

(56) References Cited

U.S. PATENT DOCUMENTS

2013/0148430 A1\* 6/2013 Shiino ................ G11C 11/5628
 365/185.18
2013/0163327 A1 6/2013 Karakulak et al.

OTHER PUBLICATIONS

Cao, et al., "Mitigation of Inter-Cell Interference in Flash Memory With Capacity-Approaching Variable-Length Constrained Sequence Codes", in IEEE Journal on Selected Areas in Communications, vol. 34, No. 9, pp. 2366-2377, Sep. 2016.
Li, et al., "On the Capacity of the Flash Memory Channel with Inter-cell Interference", 2019 IEEE International Symposium on Information Theory (ISIT), Paris, France, 2019, pp. 1007-1011.
Nachmani, et al., "Deep Learning Methods for Improving Decoding of Linear Codes", in IEEE Journal of Selected Topics in Signal Processing, vol. 12, No. 1, pp. 119-131, Feb. 2018.
Yassine, et al., "Model-Based Detector for SSDs in the Presence of Inter-cell Interference", ArXiv abs/1902.01212 (2019), 24 pages.
International Search Report and Written Opinion dated Jul. 28, 2020 corresponding to International Application No. PCT/IB2020/000150, 13 pages.

\* cited by examiner

DECODING OF HIGH-DENSITY MEMORY CELLS IN A SOLID-STATE DRIVE

BACKGROUND

The disclosure generally relates to memory and to accessing data in memory.

NAND flash memory comprises an array of floating gate transistors (hereinafter "memory cells") that store charge. This charge isencoded as a single bit or multiple bit values based on the level of charge at each memory cell. The memory comprises several blocks, each of which comprises several (e.g. 32, 64, 128, etc.) pages of memory cells. Many types of error-correcting codes (e.g., Hamming codes, Bose-Chaudhuri-Hocquenghem codes) have been implemented in NAND flash memory in order to compensate for bad memory cells. Typical NAND flash memory systems space out memory cells in order to reduce inter cell interference (ICI) caused by leaking voltage from adjacent memory cells.

BRIEF DESCRIPTION OF THE DRAWINGS

Aspects of the disclosure may be better understood by referencing the accompanying drawings.

DESCRIPTION

Figure 1:
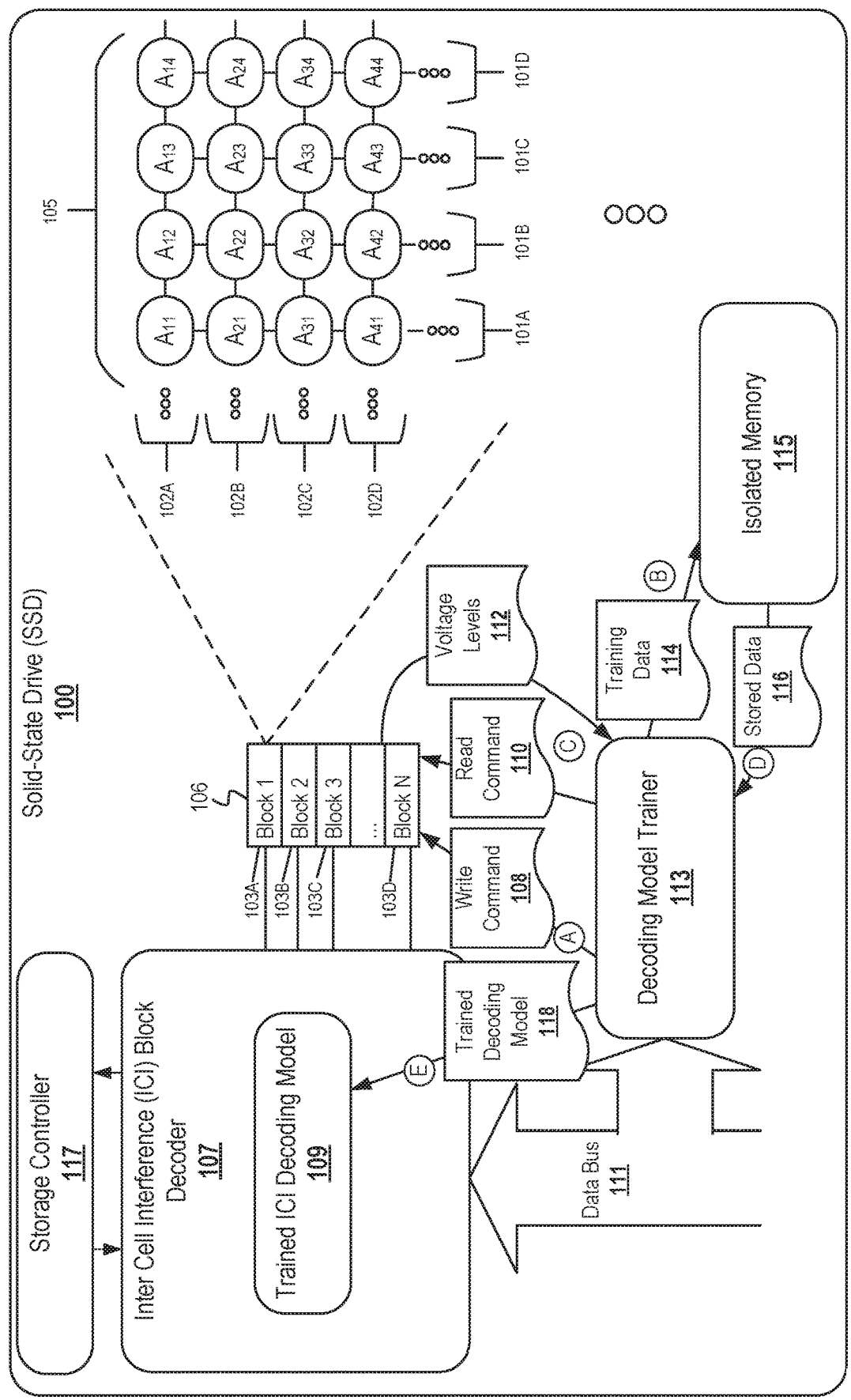
FIG. 1 is a conceptual diagram of a solid-state drive with densely packed memory cells and an ICI block decoder in accordance with an embodiment of the present disclosure.

The description that follows includes example systems, methods, techniques, and program flows that depict various aspects of the disclosure. However, it is noted that this disclosure may be practiced without these specific details. For instance, this disclosure refers to block decoding by learning memory cell weights in illustrative examples. Aspects of this disclosure can be applied instead to learning other various other parameters of the memory cells. In other instances, various instruction instances, protocols, structures and techniques have not been shown in detail in order not to obfuscate the description.

Overview

Solid state drives (SSDs) have increasingly used NAND flash memory due to their inherently faster read operations than other persistent storage devices. A potential issue in NAND flash memory occurs when memory cells are densely packed and experience significant inter cell interference (ICI). In some cases such ICI can be caused by voltage leakage from adjacent cells. Typical systems therefore avoid densely packing cells so that bit values read from a memory cell are not corrupted by voltage leakage of nearby memory cells.

Disclosed herein is a decoding technique for determining bits values in densely packed NAND flash memory. The techniques described herein provide increased storage capacity without increasing die size by leveraging diversity gain from ICI. ICI has an unexpected benefit of increasing diversity gain at each memory cell due to information propagation from adjacent cells. This increased diversity gain leads to improved performance for read operations and makes the memory robust to cell errors. The disclosed decoding technique leverages ICI to reliably and efficiently recover true bit values (i.e. voltage levels) at memory cells. To resolve ICI when memory cells are densely packed, a decoder is applied to bit values derived from voltage levels at memory cells using bit values derived from voltage levels at adjacent or nearby memory cells. This decoder is trained when calibrating the NAND flash memory (i.e. during the manufacturing process) and is be retrained periodically as the interference pattern of nearby memory cells changes over time. The decoder is trained using data patterns from training data that will be stored in memory. A block decoder comprising the decoder receives the training data from an external data source via a data bus and stores the data separately for training while writing the data to the NAND flash memory. Based on the resulting voltage values or voltage level derived thereof at each memory cell, the decoder learns to recover the data in storage for future read operations. The decoder can be a convolutional neural network (CNN) that learns the weights, at each cell, of the 8 adjacent cells using a cross-entropy loss function, or other suitable function to measure a difference between the output of the CNN and the data stored separately for training. The predicted data value at a memory cell is a combination of data values at the adjacent cells and the corresponding decoder weights. Once trained, the decoder decodes bit values in memory cells to recover the true data values. This method can be applied to single-level cell (SLC), multi-level cell (MLC), triple-level cell (TLC), and quad-level cell (QLC) memories for which different voltage levels of a cell correspond to different bit values.

Example Illustrations

FIG. 1 is a conceptual diagram of a solid-state drive with densely packed memory cells and an ICI block decoder in accordance with an embodiment of the present disclosure. A solid-state drive 100 comprises a page of densely packed memory cells 105. The page of memory cells 105 comprises word lines 102A, 102B, 102C, and 102D and bit lines 101A, 101B, 101C, and 101D. Although depicted with four bit lines, four word lines, and 16 memory cells, the size of the page 105 can vary. Typical page sizes include 512 bytes, 2048 bytes, or 4096 bytes. Each block among a set of blocks 106 comprising block 1 103A, block 2 103B, block 3 103C, through block N 103D comprises a page or set of pages. Block size (i.e. number of pages) can vary. Typical block sizes are 16 kilobytes, 128 kilobytes, 256 kilobytes, and 512 kilobytes. An ICI block decoder 107 comprising a trained ICI decoding model 109 is communicatively coupled to a data bus 111 and receives commands to read memory. A storage controller 117 of the SSD 100 is communicatively coupled with the ICI block decoder 107 to send instructions for read, write, and erase operations. In response to a read command, the ICI block decoder 107 receives bit values from one or more of the blocks 106 and inputs the bit values into the trained ICI decoding model 109 to generate decoded bit values which it sends back to the data bus 111 to be forwarded to a client/user interface. The data bus 111 can be additionally communicatively coupled to the pages of densely packed memory cells with each page (e.g., the page 105) in order to perform write/erase operations by adding and nullifying voltage at each cell respectively. Although the write operations can be performed for specific pages, erase operations occur across all pages in a block of memory. The ICI block decoder 107 is communicatively coupled with a decoding model trainer 113 in communication with isolated memory 115 comprising memory cells that are not densely packed. The decoding model trainer 113 is configured to retrain/update the trained ICI decoding model 109 by comparing data stored in isolated memory 115 which experience minimal effects of ICI with data stored in the blocks 106 of densely packed memory cells.

FIG. 1 is annotated with a series of letters A-E. These letters represent stages of operations. Although these stages are ordered for this example, the stages illustrate one example to aid in understanding this disclosure and is not to be construed as being the only order by which the respective operations can be performed or as limiting the claims. Subject matter falling within the scope of the claims can vary with respect to which operations are performed as well as to their order. The stages depicted in FIG. 1 describe operations for retraining or updating the trained ICI decoding model 109 to detect ICI leakage patterns as they change across memory cells on the SSD 100.

At stage A, the decoding model trainer 113 sends a write command 108 to the blocks 106. The write command 108 comprises a set of addresses in memory and a set of bit values to store at each address. These bit values (i.e. voltage values to be stored at the addresses in memory) correspond to training data for a decoding model. As the memory cells populate with the bit values in the write command 108, voltage leaks across memory cells in a pattern based on proximity of the memory cells.

At stage B, the decoding model trainer 113 sends training data 114 to the isolated memory 115. The training data 114 is identical to the bit values stored in the write command 108 sent at stage A. The isolated memory 115 does not incur the full effects of ICI (for example, by having memory cells that are spaced out) and stores the bit values with minimal leakage/errors.

At stage C, the decoding model trainer sends a read command 110 to the blocks 106 and receives the corresponding voltage levels 112. The read command 110 comprises a set of addresses at which to read voltage levels in memory. This set of addresses can be identical to the set of addresses at stage A or can be the set of addresses at stage A as well as neighboring addresses in memory. Inasmuch as voltage levels at neighboring addresses are affected by the write command 108 at stage A, the read command 110 attempts to capture these effects. The voltage levels 112 are returned from the corresponding addresses in memory indicated by the read command 110.

At stage D, the decoding model trainer 113 retrieves the stored data 116 from the isolated memory 115. The stored data 116 and the training data 114 should be identical when a ratio of the total memory cells in the isolated memory 115 are reliable, and the isolated memory 115 can run an error correcting code on the training data 114 stored in memory to detect and compensate for faulty memory cells. As opposed to reversing the effects of ICI on memory cells which occurs across all memory cells, the error correcting code detects memory cells that are faulty up to a ratio of total memory cells and reverses bit values derived from voltage levels at the faulty memory cells.

At stage E, the decoding model trainer trains a decoding model 118 using the voltage levels 112 and the stored data 116. The trained decoding model 118 is then implemented/updated by the ICI block decoder 107 as the trained ICI decoding model 109. The trained decoding model 118 can be any of the embodiments for the trained ICI decoding model 109 described below. Although depicted as a separate trained decoding model 118, the decoding model trainer 113 can update the trained ICI decoding model 109 directly (for example, by performing training iterations on the existing trained ICI decoding model 109 using the store data 116 and the voltage levels 112). The decoding model trainer 113 can train the trained decoding model 118 separately from the ICI block decoder 107 or can be implemented as a component of the ICI block decoder 107 (not pictured). Any of the aforementioned read/write commands and training operations can be performed by the ICI block decoder 107.

The trained ICI decoding model 109 is any model that can be trained to predict true bit values at memory cells in memory based on bit values at adjacent memory cells. Specifically, let $y_{ij}$ be the bit value read from the (i, j)th cell, and let $A_{ij}$ be the true value stored at this cell. In order to construct an estimator $\widehat{A_{ij}}$ for the true bit value, a simplifying assumption is made that the estimator is a linear function of the 8 neighboring cell values, $\widehat{A_{ij}} = \Sigma_{l=-1}^{1}\Sigma_{m=-1}^{1} w_{lm} y_{i+k,j+m}$. Other simplifying assumptions can be used, such as that the estimator is any function of nearby neighboring cell values. "Nearby neighboring cell values" can mean cell values at the 8 adjacent cells, cell values for cells within a neighborhood of the given cell according to a metric in the cell array (e.g. Manhattan distance), etc. The problem of learning the estimator $\widehat{A_{ij}}$ therefore becomes the problem of determining the optimal weights $w_{lm}$ so that the error err (A, Â) is minimized (here, err(x, y) is some error function running over all cells).

A convolutional neural network (CNN) learns, in an embodiment, to predict the weights $w_{lm}$ at each cell. In the case of SLC memory (i.e. one bit per cell), a sigmoid function is added to clip the estimator to be in the range [−1,1], $\widehat{A_{ij}} = \text{sgm}(\Sigma_{l=-1}^{1}\Sigma_{m=-1}^{1} w_{lm} y_{i+k,j+m})$, where sgm(x) is the sigmoid function. For MLC, TLC, and QLC memories, one can use a clipping function $\widehat{A_{ij}} = \text{clp}(\Sigma_{l=-1}^{1}\Sigma_{m=-1}^{1} w_{lm} y_{i+k,j+m})$, where clp(x)=x if |x|<n and clp(x)=x/|x| otherwise for some fixed n. Note that in both cases, these estimators are convolutional layers in a neural network with activation functions, and the weights $w_{lm}$ at each cell are learned as internal network parameters. Although described above with a single layer and activation functions, other suitable CNNs are provided with different architectures and in some implementations different internal layers. The architecture of the CNN can depend on the amount of available training data, the size of the pages/blocks in memory, etc.

When training using any of the above methods to predict true bit values at each cell, the ICI block decoder 107 receives true bit values from the data bus 111 and store the true bit values (denoted $A_{ij}$ above) in isolated memory 115. For example, the isolated memory 115 can comprise a separate set of blocks that have memory cells that are not densely packed and use error-correcting codes to reliably decode stored memory in order to store training data corresponding to the true bit values. Depending on the type of algorithm used to compute the memory cell weights, different amounts of training data can be used. For example, for a CNN, thousands of sample inputs/outputs (y, A) should be used whereas for the other estimators less training is appropriate (here, y is a matrix of bit values read from memory cells and A is a matrix of true values for those memory cells). The scale of the above estimator is across all memory, but estimators can be localized to each block in memory. Moreover, the estimators can be optimized to more efficiently compute smaller blocks of memory based on a read operation from the data bus 111.

Training operations for the ICI block decoder 107 occur when the SSD 101 is calibrated at the manufacturing stage. As memory cells in the SSD become unreliable due to repeated use, the ICI decoding model is retrained using data to be written to memory in order to more accurately model the new patterns of ICI. Retraining can occur, for instance, each time the SSD 101 is reformatted and new data is added to memory or more often. Retraining operations occur at varying time scales because each retraining exerts wear and tear on memory cells. For example, retraining can occur at fixed intervals, whenever the data bus 111 sends certain operations to the ICI block decoder 107, etc.

The above estimator estimates the true bit values $A_{ij}$ using the measured bit values from 8 adjacent cells to each memory cell to be estimated. In other embodiments, values from all cells are be used to estimate a single cell. As an illustrative example, for a CNN with multiple internal layers each output neuron (i.e. each estimated bit value) is a function of any combination of inputs to the network. More complex models that incorporate macroscopic information in this manner may require more training data and more frequent retraining.

Figure 2:
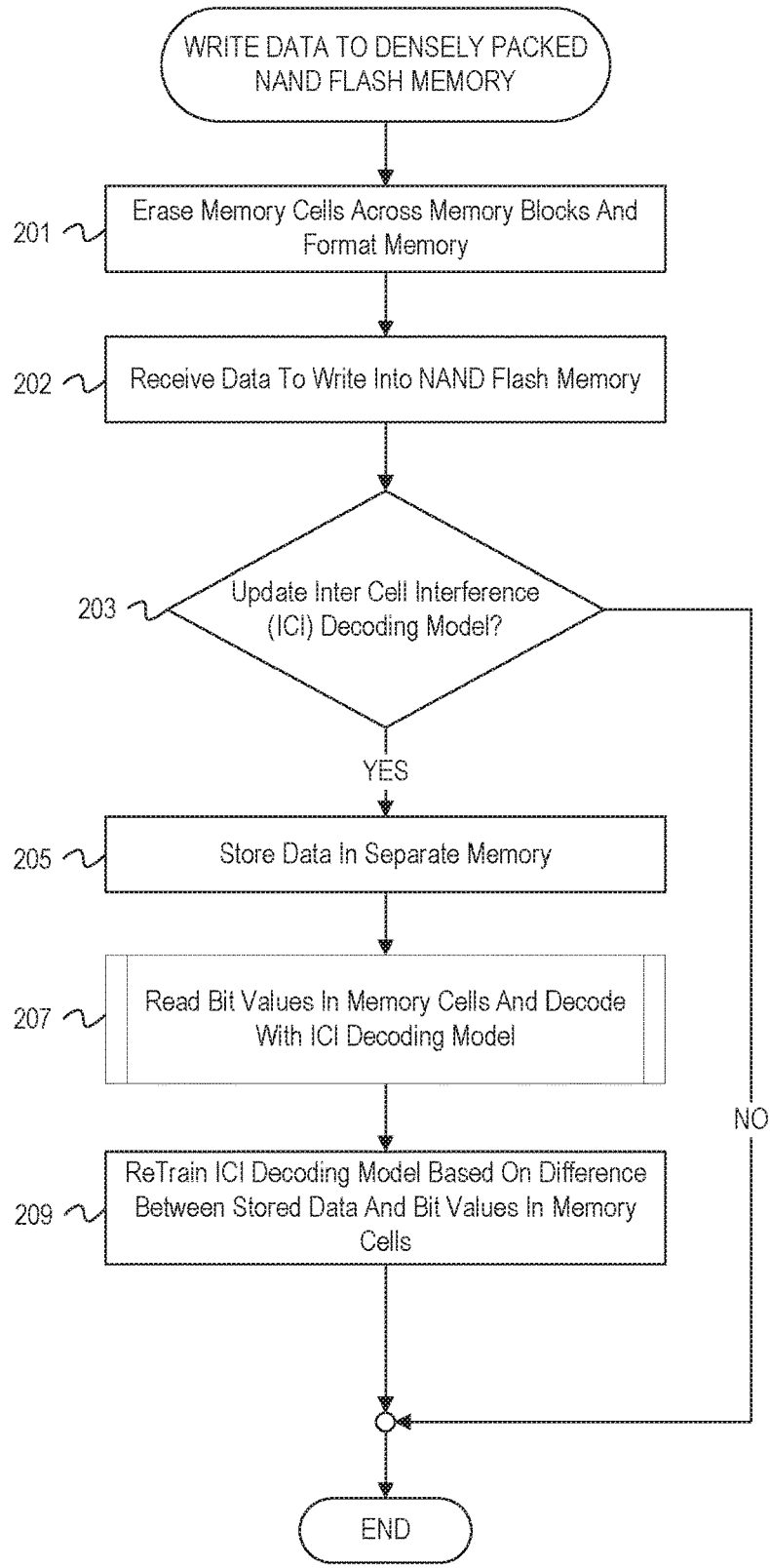
FIG. 2 is a flowchart of example operations for writing data to densely packed NAND flash memory in accordance with an embodiment of the present disclosure.
Figure 3:
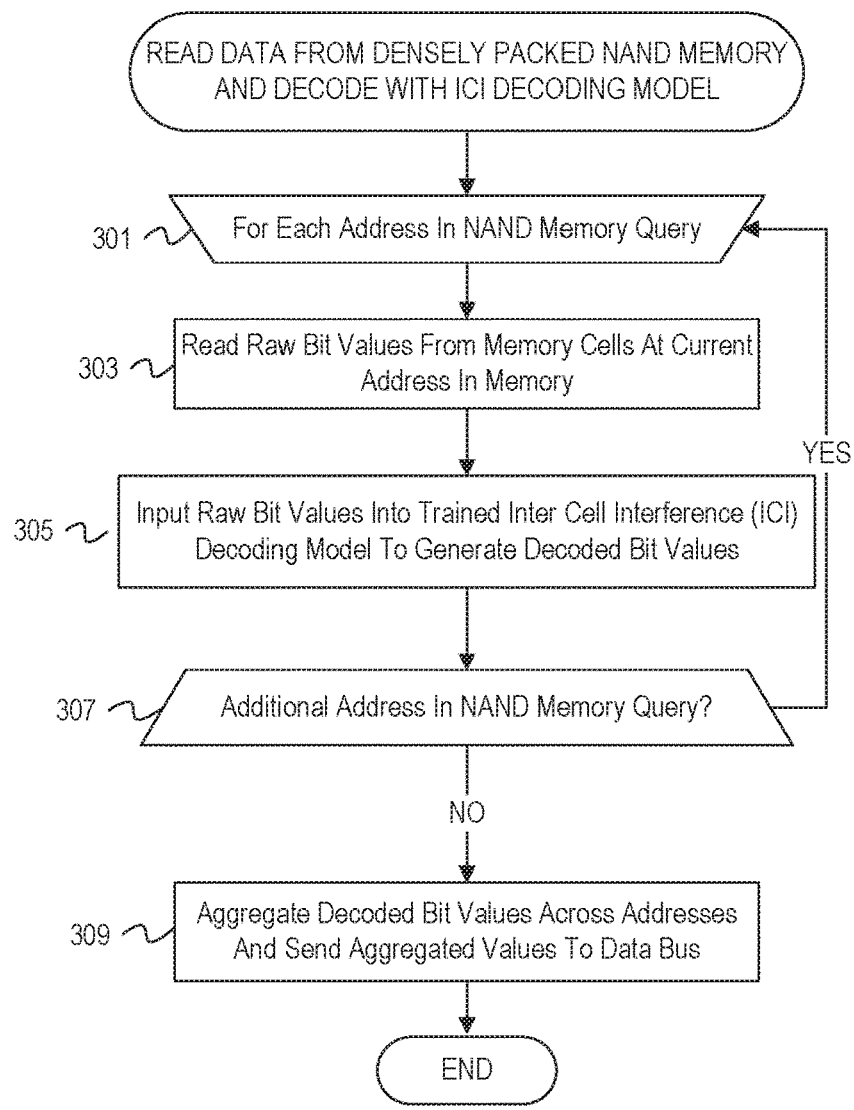
FIG. 3 is a flowchart of example operations for reading data from densely packed NAND memory and decoding with an ICI decoding model in accordance with an embodiment of the present disclosure.

FIG. 2 is a flowchart of example operations for writing data to densely packed NAND flash memory in accordance with an embodiment of the present disclosure. The example operations in FIGS. 2 and 3 are described with reference to an ICI block decoder for consistency with the earlier figure(s).

At block 201, the ICI block decoder erases memory cells across memory blocks in the NAND flash memory and formats the memory. Due to the architecture of NAND flash memory, erase operations occur at the scale of memory blocks. The formatting operation can include erasing and/or constructing a folder system in memory. The structure of the folder system can be hardcoded or can be embedded in an erase query from an external device and sent to the ICI block decoder via a data bus. The erase operation and corresponding query comprises one or multiple blocks in memory as specified by a memory address.

At block 202, the ICI block decoder receives data to write into flash memory. The ICI block decoder can be communicatively coupled to an external computer-readable medium and can receive data in a stream, in packets with metadata indicating locations in the folder system to store each data packet, in blocks of data to be stored at hard coded locations in memory, etc. In some embodiments, incoming data is stored at sequential addresses in memory or at addresses in a hardcoded sequence.

At block 203, the ICI block decoder determines whether to update an ICI decoding model. A trigger for updating or retraining is time based or event based, and a storage device can be programmed/configured to use different types of triggers. This determination can be based on a predetermined schedule for updating the ICI decoding model, whether the NAND flash memory has been recently erased/formatted, the amount of time since the ICI block decoding model was last trained, validation error for the ICI block decoding model, etc. For example, the ICI block decoder can test the ICI block decoding model by storing incoming data for a write operation in separate memory, write the data to memory, and perform a read operation using the ICI block decoding model to verify that the read data is consistent with the data stored in separate memory. Using "live" writes to incrementally updates/retrain the decoding model over time facilitates adaptation of the decoding model to changing ICI patterns that occurs with use of the flash memory. If the ICI block decoder determines that the ICI block decoding model should be updated, operations continue to block 205. Otherwise, operations in FIG. 2 terminate.

At block 205, the ICI block decoder stores the data received by the ICI block decoder at block 202 in separate memory. The ICI block decoder can automatically forward received data to the ICI block decoder or can send the data in response to a query from the ICI block decoder when a determination is made to update the ICI decoding model at block 203. The separate memory can be separate NAND flash memory stored on a solid-state drive (SSD) comprising both the ICI block decoder and the ICI block decoder or can be any other persistent storage medium.

At block 207, the ICI block decoder reads bit values from memory cells in the densely packed NAND flash memory and decodes the bit values with the ICI decoding model. The ICI block decoder can comprise an address bus that accesses word lines at addresses indicated by the read query to the NAND flash memory. The read operation can be performed at a granularity as fine as pages of memory, whereas the erase operation occurs at the granularity of a block. The ICI block decoder can comprise a page decoder that identifies pages corresponding to the addresses in the read query. The operations of reading and decoding data from the densely packed NAND memory are described in greater detail with reference to FIG. 3.

At block 209, the ICI decoder retrains the decoding model based on the difference between the data stored at block 205 and the bit values in the memory cells read at block 207. For instance, the ICI decoder reinitializes internal weights of a convolutional neural network (CNN). The ICI decoder then uses the bit values in the memory cells as input to the CNN and updates the weights of internal layers of the CNN based on the difference between the CNN output and the stored data e.g. by backpropagation. The ICI decoder can maintain part of the stored data and corresponding bit values as validation data and can test the retrained decoding model using the validation data.

FIG. 3 is a flowchart of example operations for reading data from densely packed NAND memory and decoding with an ICI decoding model in accordance with an embodiment of the present disclosure. At block 301, an ICI block decoder begins iterating over addresses in a NAND memory query. The memory addresses can be received in a stream or can be received in batches. The operations in FIG. 3 can be performed as the ICI block decoder receives addresses, after the ICI block decoder receives a threshold number of addresses, at predetermined intervals, etc.

At block 303, the ICI block decoder reads raw bit values from memory cells at a current address in memory. The ICI block decoder can comprise a page decoder that determines the page corresponding to the current address. Memory is accessed via a word line for the page of the current address in memory. The bit values are converted from voltage values read at each memory cell based on the type of memory e.g. SLC, MLC, TLC, QLC, etc.

At block 305, the ICI block decoder inputs raw bit values into the trained inter cell interference (ICI) decoding model to generate decoded bit values. For each memory cell corresponding to the read address, the ICI block decoder "recovers" or determines the bit value likely written to the memory cell based on the voltage level read from the memory cell and voltage levels of the neighboring memory cells. Thus, the ICI block decoder iterates over the memory cells being read and uses the decoding model with voltage levels of neighboring memory cells in each iteration. Depending on the type of trained ICI decoding model, raw bit values can be input either for each address in memory or across multiple addresses in the NAND memory query. In embodiments where the input is across multiple addresses in the NAND memory query, the raw bit values from block 303 isbe stored in a register or other external storage medium. The decoding of these aggregated bit values can be performed after the loop of operations depicted at blocks 301, 303, 305, and 307. The decoded bit values can additionally be maintained in a register or other fast storage medium to be aggregated with raw bit values from other pages. Alternatively, the ICI block decoder can immediately forward the decoded bit values to a data bus communicatively coupled to an external storage medium.

At block 307, the ICI block decoder determines whether there is an additional address in the NAND memory query. If there is an additional address in the query, operations return to block 301. Otherwise, operations continue to block 309.

At block 309, the ICI block decoder aggregates the decoded bit values across the addresses in the NAND memory query and sends the aggregated decoded bit values to a data bus. The decoded bit values can be stored in a register or other external storage medium during the operations at blocks 301, 303, 305, and 307. Alternatively, in embodiments where the input to the decoding model is the entire memory for the NAND memory query, the decoded bit values can be received/aggregated directly as output from the decoding model.

Figure 4:
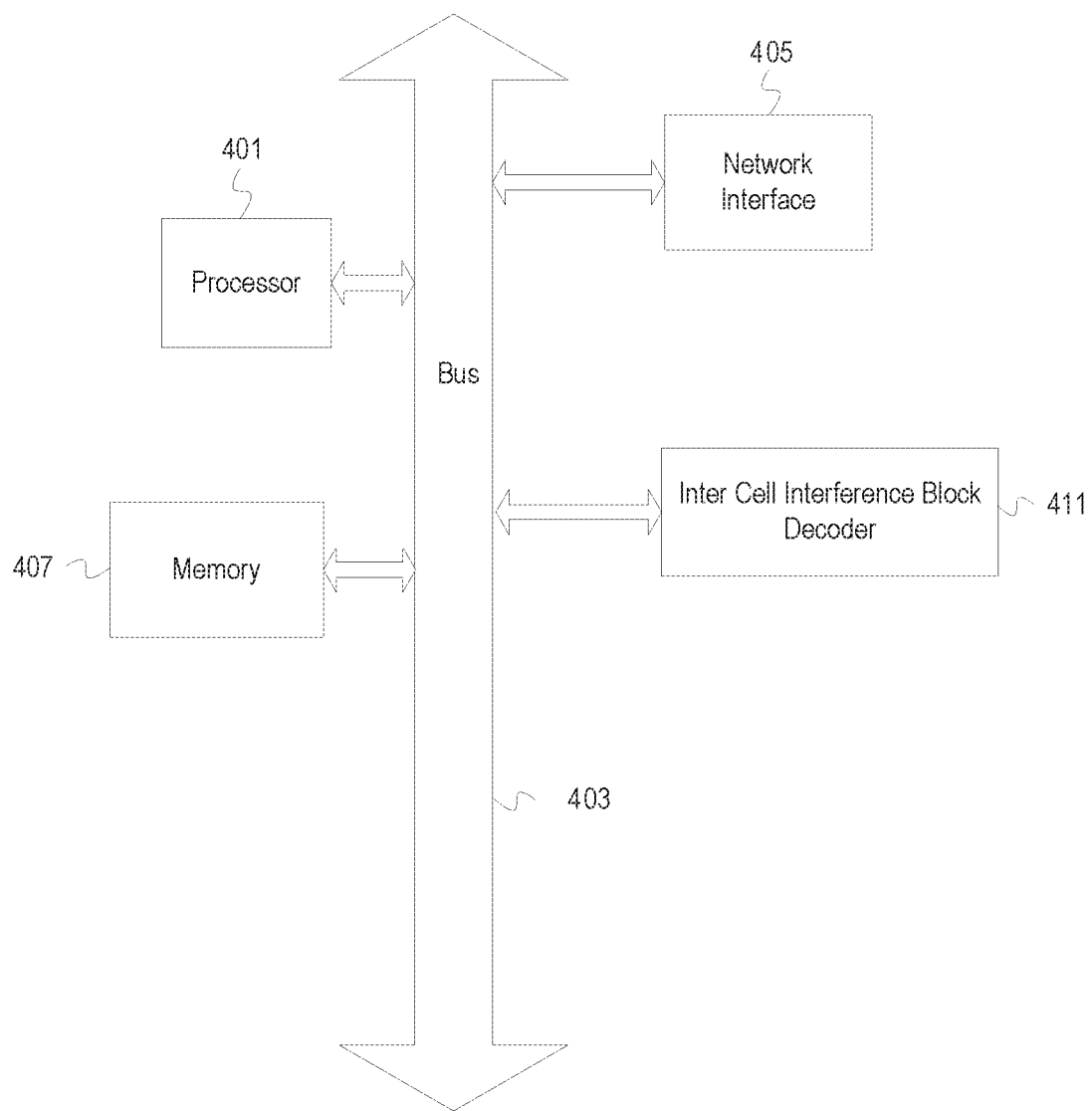
FIG. 4 depicts an example computer system with an inter cell interference (ICI) block decoder in accordance with an embodiment of the present disclosure.

FIG. 4 depicts an example computer system with an inter cell interference (ICI) block decoder in accordance with an embodiment of the present disclosure. The computer system includes a processor 401 (possibly including multiple processors, multiple cores, multiple nodes, and/or implementing multi-threading, etc.). The computer system includes memory 407. The memory 407 may be system memory or any one or more of the above already described possible realizations of machine-readable media. The computer system also includes a bus 403 and a network interface 405. The system also includes an ICI block decoder 411. The ICI block decoder 411 can receive raw bit values from blocks of data in densely packed NAND memory, can decode the raw bit values to recover true bit values, and can perform read, write, and erase operations on blocks or pages of the densely packed NAND memory as described variously above. Any one of the previously described functionalities may be partially (or entirely) implemented in hardware and/or as software running on the processor 401. For example, the functionality may be implemented with an application specific integrated circuit, in logic implemented in the processor 401, in a co-processor on a peripheral device or card, etc. Further, realizations may include fewer or additional components not illustrated in FIG. 4 (e.g., video cards, audio cards, additional network interfaces, peripheral devices, etc.). The processor unit 401 and the network interface 405 are coupled to the bus 403. Although illustrated as being coupled to the bus 403, the memory 407 may be coupled to the processor 401.

Variations

In some embodiments, for the estimator described above with reference to FIG. 1, the weights $w_{lm}$ are computed at each cell using a linear minimum mean square error (LMMSE) estimator that minimizes the error function MSE $(A, \hat{A}) := \Sigma_{i,j}(A_{ij} - \widehat{A_{ij}})^2$, where the summation runs over all cells. This minimization can be represented as the optimization problem $$\min_{W,b} MSE(A, \hat{A})$$

such that $\hat{A} = Wy$. This optimization has a closed form solution, and the weight matrix W for the optimal pair (W, b) gives the weights $w_{lm}$ to be used at each cell.

In another embodiment, a fast-Fourier transform (FFT) method is used to compute the weights $w_{lm}$. As disclosed above, the simple linear estimator $\widehat{A_{ij}} = \Sigma_{l=-1}^{1} \Sigma_{m=-1}^{1} w_{lm} y_{i+k, j+m}$ can actually be represented as a convolution $\hat{A} = W*Y$, where W is a matrix of cell weights and Y is a matrix of true bit values. In the Fourier domain, the convolution operation becomes multiplication, i.e. $\mathcal{F} \hat{A} = \mathcal{F} W \mathcal{F} Y$, where $\mathcal{F}$ is the discrete Fourier transform. Solving for W, we have that $$W = \mathcal{F}^{-1}(\mathcal{F} \hat{A} (\mathcal{F} Y)^{-1}).$$

When $\hat{A}$ and Y have a scale equal to the entire memory, this computation can be prohibitively expensive. Therefore, subblocks of the matrix W (e.g. 32×32, 64×64 blocks) can be computed separately using the above methods. These subblocks arebe merged using, for instance, an averaging operation on the computed values of the matrix W (i.e. by averaging a certain amount of surrounding entries to get each entry in the matrix W). In some embodiments, the averaging operation can occur near the edges of blocks to reduce distortion near edges.

The invention claimed is:

1. A method of decoding data from high density memory comprising:
    reading voltage levels from a first memory cell and a set of one or more neighboring memory cells of flash memory in response to a read command with an address corresponding to the first memory cell;
    inputting the voltage levels into a trained model that has been trained on the flash memory to estimate bit values written to a memory cell based on respective voltage values read from the first memory cell and from the neighboring memory cells according to a layout of memory cells of the flash memory;
    obtaining from the trained model an estimated bit value written to the first memory cell based on the respective voltage levels of the first memory cell and the neighboring memory cells having been input into the trained model; and
    outputting the estimated bit value in response to the read command.

2. The method of claim 1 further comprising:
    training a model to learn voltage value patterns among the memory cells of the flash memory, wherein the training comprises writing a variety of data to different addresses of the flash memory, further wherein the voltage value patterns are based, at least in part, on voltage leakage across neighboring memory cells; and
    loading the trained model as a trained decoding model for a decoder of a storage controller that accesses the flash memory.

3. The method of claim 2 further comprising updating the trained decoding model based on data of a write command for the flash memory.

4. The method of claim 3, wherein updating the trained decoding model comprises:
   prior to the write command, detecting a trigger to update the trained decoding model;
   writing the data of the write command to an isolated memory that is separate from the flash memory and to a first set of memory cells of the flash memory, wherein memory cells of the isolated memory experience reduced effects of voltage leakage across neighboring memory cells; and
   training the trained decoding model to learn voltage value patterns at least with respect to the first set of memory cells of the flash memory to which the data was written, wherein the training of the trained decoding model uses the data of the write command and voltage levels read from the first set of memory cells to which the data was written and memory cells neighboring the first set of memory cells.

5. The method of claim 4, wherein training the trained decoding model to learn voltage value patterns comprises:
   inputting the voltage levels read from the first set of memory cells into a model to generate predicted data;
   inputting the predicted data and data of the write command into a loss function to generate one or more loss values, wherein the loss function measures a difference between the predicted data and the data of the write command as the one or more loss values; and
   updating internal parameters of the trained decoding model based on the one or more loss values.

6. The method of claim 5, wherein updating the internal parameters of the trained decoding model comprises back-propagating the one or more loss values.

7. The method of claim 2, wherein training the model to learn voltage value patterns among the memory cells of the flash memory comprises:
   writing data of a write command to a memory that is separate from the flash memory and writing data of the write command to a second set of memory cells of the flash memory;
   computing a Fourier transform of the voltage values read from the second set of memory cells to which the data was written, wherein computing the Fourier transform of voltage values comprises forming a matrix of voltage values corresponding to an arrangement of the voltage values in the second set of memory cells and multiplying the matrix of voltage values by a discrete Fourier matrix;
   inverting the Fourier transform of the voltage values;
   multiplying the inverted Fourier transform of the voltage values by the Fourier transform of the data written to the memory separate to the flash memory to generate a matrix of Fourier weights for the second set of memory cells; and
   multiplying the matrix of Fourier weights by an inverted Discrete Fourier matrix to generate a matrix of weights for the second set of memory cells.

8. The method of claim 1, wherein inputting the voltage levels into the trained model to estimate bit values written to the memory cell comprises:
   computing a linear combination of the voltage levels from the first memory cell and the set of one or more neighboring memory cells; and
   inputting the linear combination of the voltage levels into an activation function and thresholding the output of the activation function to generate the estimated bit values.

9. A non-transitory, machine-readable medium having program code stored thereon for reading data from high density memory, the program code comprising instructions to:
   read voltage levels from a first memory cell and a set of one or more neighboring memory cells of flash memory in response to a read command with an address corresponding to the first memory cell;
   input the voltage levels into a trained model that has been trained on the flash memory to estimate bit values written to a memory cell based on respective voltage values read from the first memory cell and from the neighboring memory cells according to a layout of memory cells of the flash memory;
   obtain from the trained model an estimated bit value written to the first memory cell based on the voltage levels having been input into the trained model; and
   return the estimated bit value in response to the read command.

10. The non-transitory, machine-readable medium of claim 9, wherein the program code further comprises instructions to:
    train a model to learn voltage value patterns among the memory cells of the flash memory, wherein the training comprises writing a variety of data to different addresses of the flash memory, further wherein the voltage value patterns are based, at least in part, on voltage leakage across neighboring memory cells; and
    load the trained model as a trained decoding model for a decoder of a storage controller that accesses the flash memory.

11. A high density solid-state storage device comprising:
    a flash memory array including densely packed memory cells; and
    a controller programmed to,
    based on receipt of a read command that indicates a first address, read first voltage levels from a first set of memory cells corresponding to the first address;
    for each of the first set of memory cells,
       input the voltage levels into a trained model that has been trained on the flash memory to estimate bit values written to a memory cell based on respective voltage values read from the first set of memory cells according to a layout of memory cells of the flash memory; and
       obtain from the trained model a bit value for the memory cell; and
    return the bit values in response to the read command.

12. The solid-state storage device of claim 11, wherein the controller is further programmed to:
    train a model to learn voltage value patterns among the memory cells of the flash memory, wherein the training comprises writing a variety of data to different addresses of the flash memory, further wherein the voltage value patterns are based, at least in part, on voltage leakage across neighboring memory cells; and
    load the trained model as a trained decoding model for a decoder of the solid-state storage device.

13. The solid-state storage device of claim 12, wherein the controller is further programmed to update the trained model based on data of a write command for the flash memory.

14. The solid-state storage device of claim 13, wherein the controller programmed to update the trained model comprises the controller programmed to:
    prior to the write command, detect a trigger to update the trained decoding model;

write the data of the write command to an isolated memory that is separate from the flash memory and to a second set of memory cells of the flash memory, wherein memory cells of the isolated memory experience reduced effects of voltage leakage across neighboring memory cells; and train the trained decoding model to learn voltage value patterns at least with respect to the second set of memory cells of the flash memory to which the data was written, wherein the training of the trained decoding model uses the data of the write command and voltage levels read from the second set of memory cells to which the data was written and memory cells neighboring the second set of memory cells.

15. The solid-state storage device of claim 14, wherein the controller programmed to train the trained decoding model to learn voltage value patterns comprises the controller programmed to:

input the voltage levels read from the second set of memory cells into a model to generate predicted data;

input the predicted data and data of the write command into a loss function to generate one or more loss values, wherein the loss function measures a difference between the predicted data and the data of the write command as the one or more loss values; and update internal parameters of the trained decoding model based on the one or more loss values.

16. The solid-state storage device of claim 15, wherein the controlled programmed to update the internal parameters of the trained decoding model comprises the controller programmed to backpropagate the one or more loss values.

17. The solid-state storage device of claim 12, wherein the controller programmed to train the model to learn voltage level patterns among the memory cells of the flash memory comprises the controller programmed to:

write data of a write command to a memory that is separate from the flash memory and writing data of the write command to a second set of memory cells of the flash memory;

compute a Fourier transform of the voltage values read from the second set of memory cells to which the data was written, wherein computing the Fourier transform of voltage values comprises forming a matrix of voltage values corresponding to an arrangement of the voltage values in the second set of memory cells and multiplying the matrix of voltage values by a discrete Fourier matrix;

invert the Fourier transform of the voltage values;

multiply the inverted Fourier transform of the voltage values by the Fourier transform of the data written to the memory separate to the flash memory to generate a matrix of Fourier weights for the second set of memory cells; and multiply the matrix of Fourier weights by an inverted Discrete Fourier matrix to generate a matrix of weights for the second set of memory cells.

18. The solid-state drive of claim 11, wherein the controller programmed to input the voltage levels into the trained model to estimate bit values written to the memory cell comprises the controller programmed to:

compute a linear combination of the voltage levels from the first memory cell and the set of one or more neighboring memory cells; and input the linear combination of the voltage levels into an activation function and thresholding the output of the activation function to generate the estimated bit values.

19. The solid-state storage device of claim 14 wherein the controller programmed to detect the trigger to update the trained decoding model comprises the controller programmed to detect one of expiration of a time period, a calibration event, and formatting of the flash memory.

20. The solid-state storage device of claim 11 wherein the memory cells comprise densely packed NAND memory cells that experience voltage leakage across neighboring memory cells.

* * * * *